United States Patent
Arnaud

(10) Patent No.: US 10,529,703 B2
(45) Date of Patent: Jan. 7, 2020

(54) OVERVOLTAGE PROTECTION DEVICE

(71) Applicant: STMicroelectronics (Tours) SAS, Tours (FR)

(72) Inventor: Aurelie Arnaud, Saint-Cyu sur Loire (FR)

(73) Assignee: STMicroelectronics (Tours) SAS, Tours (FR)

( * ) Notice: Subject to any disclaimer, the term of this patent is extended or adjusted under 35 U.S.C. 154(b) by 353 days.

(21) Appl. No.: 15/436,998

(22) Filed: Feb. 20, 2017

(65) Prior Publication Data

US 2018/0026027 A1 Jan. 25, 2018

(30) Foreign Application Priority Data

Jul. 20, 2016 (FR) ..................... 16 56923

(51) Int. Cl.
| | |
|---|---|
| H01L 23/60 | (2006.01) |
| H01L 27/02 | (2006.01) |
| H01L 21/265 | (2006.01) |
| H01L 21/324 | (2006.01) |
| H01L 27/08 | (2006.01) |
| H01L 29/06 | (2006.01) |
| H01L 29/167 | (2006.01) |
| H01L 29/36 | (2006.01) |
| H01L 29/66 | (2006.01) |
| H02H 9/04 | (2006.01) |

(52) U.S. Cl.
CPC .... *H01L 27/0255* (2013.01); *H01L 21/26513* (2013.01); *H01L 21/324* (2013.01); *H01L 27/0814* (2013.01); *H01L 29/0684* (2013.01); *H01L 29/167* (2013.01); *H01L 29/36* (2013.01); *H01L 29/66113* (2013.01); *H02H 9/044* (2013.01)

(58) Field of Classification Search
CPC .................................................. H01L 27/0255
See application file for complete search history.

(56) References Cited

U.S. PATENT DOCUMENTS

| | | | | |
|---|---|---|---|---|
| 6,191,455 | B1 * | 2/2001 | Shida .................. | H01L 27/0255 257/355 |
| 6,579,772 | B2 * | 6/2003 | Andoh .............. | H01L 29/66136 257/551 |

(Continued)

OTHER PUBLICATIONS

INPI Search Report and Written Opinion for FR 1656923 dated Mar. 17, 2017 (10 pages).

*Primary Examiner* — Eric A. Ward
(74) *Attorney, Agent, or Firm* — Crowe & Dunlevy

(57) ABSTRACT

An electrostatic discharge protection device includes the following successive structures: a very heavily-doped semiconductor substrate of a first conductivity type; a first heavily-doped buried semiconductor layer of a second conductivity type; a first lightly-doped semiconductor layer of the second conductivity type; and a second heavily-doped layer of the first conductivity type. The device further includes, located between first heavily-doped buried semiconductor layer and the first lightly-doped semiconductor layer, a third doped layer of the first conductivity type having a thickness and a dopant atom concentration configured to form, at a junction of the first lightly-doped semiconductor layer and the third layer, a diode having a reverse punchthrough operation.

11 Claims, 3 Drawing Sheets

(56) References Cited

U.S. PATENT DOCUMENTS

| | | |
|---|---|---|
| 2014/0036399 A1 | 2/2014 | Ory et al. |
| 2015/0001672 A1 | 1/2015 | Tani et al. |
| 2015/0002967 A1 | 1/2015 | Kawase et al. |
| 2015/0137305 A1 | 5/2015 | Schmenn et al. |
| 2015/0221628 A1 | 8/2015 | Arnaud |
| 2015/0221630 A1* | 8/2015 | Morrish .............. H01L 27/0248 257/499 |
| 2016/0056142 A1* | 2/2016 | Kaida ................. H01L 27/0255 257/655 |

* cited by examiner

OVERVOLTAGE PROTECTION DEVICE

PRIORITY CLAIM

This application claims the priority benefit of French Application for Patent No. 1656923, filed on Jul. 20, 2016, the disclosure of which is hereby incorporated by reference in its entirety.

TECHNICAL FIELD

The present disclosure relates to the protection of electronic circuits against overvoltages and more particularly to a device of protection against overvoltages such as electrostatic discharges.

BACKGROUND

FIG. 1 is an electric diagram illustrating an overvoltage protection circuit 1 disclosed in United States Patent Application Publication No. 2015/02221628. Circuit 1 is connected between two input/output terminals, IO1 and IO2, of a circuit to be protected and a reference terminal GND. Circuit 1 comprises, in series, between input/output terminal IO1 and reference terminal GND, a forward diode 3 and a diode 5 with a reverse-controlled avalanche voltage. The protection circuit further comprises, in series, between input/output terminal IO2 and reference terminal GND, a forward diode 7 and a diode 9 with a reverse-controlled avalanche voltage. The signal on terminals IO1 and IO2 may for example be a binary data signal. In the case of an overvoltage on terminal IO1, said overvoltage is removed by diode 3 and diode 5. The overvoltage is then limited to a voltage greater than the normal positive voltages of the data signal. In the case of an overvoltage on terminal IO2, said overvoltage is removed by diode 7 and diode 9. The overvoltage is then limited to a voltage greater than the normal positive voltages of the data signal.

It is desirable for the protection circuit to influence neither the operation nor the performance of the circuit to be protected, nor the shape of the supplied signals. Particularly, if the signal on the terminal to be protected is a binary square-pulse signal, to keep the square shape of this signal, the total capacitance of the protection circuit should be as low as possible.

SUMMARY

An embodiment provides a device of protection against electrostatic discharges having a low capacitance.

An embodiment provides a device of protection against electrostatic discharges successively comprising: a very heavily-doped semiconductor substrate of a first conductivity type; a first heavily-doped buried semiconductor layer of a second conductivity type; a first lightly-doped semiconductor layer of the second conductivity type; and a second heavily-doped layer of the first conductivity type, the device further comprising, between the first buried layer and the first layer, a third doped layer of the first conductivity type, having a thickness and a dopant atom concentration capable of forming at the junction of the first layer and of the third layer a diode having reverse bias punchthrough operation.

According to an embodiment, the first buried layer, the third layer, the first layer, and the second layer are stacked on a first portion of the substrate, wherein the substrate further comprises a second region supporting: a second heavily-doped buried semiconductor layer of the first conductivity type; a fourth lightly-doped semiconductor layer of the second conductivity type; and a fifth heavily-doped semiconductor layer of the first conductivity type.

According to an embodiment, the third layer has a thickness in the range from 0.5 to 3 µm, sufficiently thin to avoid affecting the circuit operation in the avalanche.

According to an embodiment, the third layer has a maximum dopant atom concentration in the range from $5 \times 10^{14}$ to $5 \times 10^{16}$ atoms/cm$^3$.

According to an embodiment, the first and fourth layers are formed simultaneously.

According to an embodiment, the first layer is formed by epitaxy.

According to an embodiment, a first contact metallization rests on the second layer and a second contact metallization rests on the fifth layer.

Another embodiment provides a circuit of protection against discharges capable of occurring on a first input/output terminal of a circuit to be protected, the protection circuit comprising in series between said terminal and a reference terminal: a first forward diode; a reverse diode having a punchthrough operation; a second forward diode; and a first diode with a reverse-controlled avalanche voltage.

According to an embodiment, the protection circuit further comprises in series, between a second input/output terminal of the circuit to be protected and the reference terminal: a third forward diode; and a second diode with a reverse-controlled avalanche voltage.

Another embodiment provides a method of manufacturing a device of protection against electrostatic discharges comprising the steps of: implanting into a very heavily-doped semiconductor substrate of a first conductivity type a first heavily-doped buried layer of a second conductivity type; implanting into the substrate a second heavily-doped buried layer of the first conductivity type; forming by epitaxy a first lightly-doped layer of the second conductivity type; and forming a second heavily-doped layer of the first conductivity type, the method comprising performing a series of anneals causing the diffusion of the dopant atoms from the substrate through the first buried layer, to form a third layer of the first conductivity type between the first buried layer and the first layer.

According to an embodiment, the dopant atom diffusion coefficient of the substrate is greater than the dopant atom diffusion coefficient of the first buried layer.

According to an embodiment, the substrate is boron-doped and the first buried layer is arsenic-doped.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
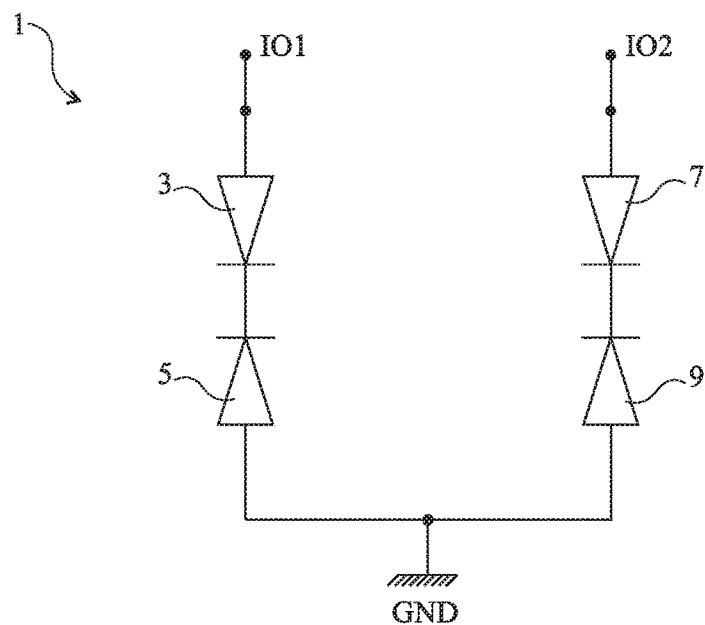
FIG. 1, previously described, illustrates a circuit of protection against electrostatic discharges.

For clarity, the same elements have been designated with the same reference numerals in the various drawings and, further, the various drawings are not to scale. For clarity, only those elements which are useful to the understanding of the described embodiments have been shown and are detailed.

In the following description, when reference is made to terms qualifying an absolute position, such as term "rear", or a relative position, such as terms "upper" and "lower", reference is made to the orientation of the drawings. Unless otherwise specified, expression "in the order of" means to within 10%, preferably to within 5%.

Figure 2:
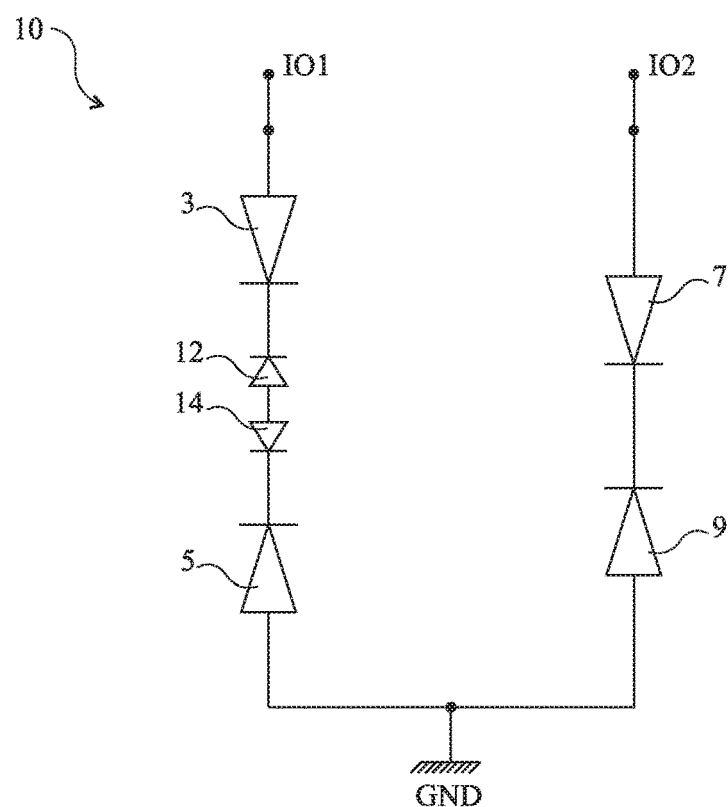
FIG. 2 illustrates an embodiment of a circuit of protection against electrostatic discharges.

FIG. 2 is an electric diagram of an embodiment of a circuit 10 of protection against electrostatic discharges. Circuit 10 comprises the same elements designated with the same reference numerals as circuit 1 shown in FIG. 1. Circuit 10 further comprises, in series between diode 3 and diode 5, a reverse diode 12 and a forward diode 14. Diode 12 is of the type having a punchthrough operation, that is, it is reverse-conducting with a very low voltage drop. The assembly of diodes 12 and 14 thus does not affect the operation of the protection circuit in the avalanche but introduces two additional series capacitances due to the introduction of two additional junctions: the junctions corresponding to diodes 12 and 14.

Figure 3:
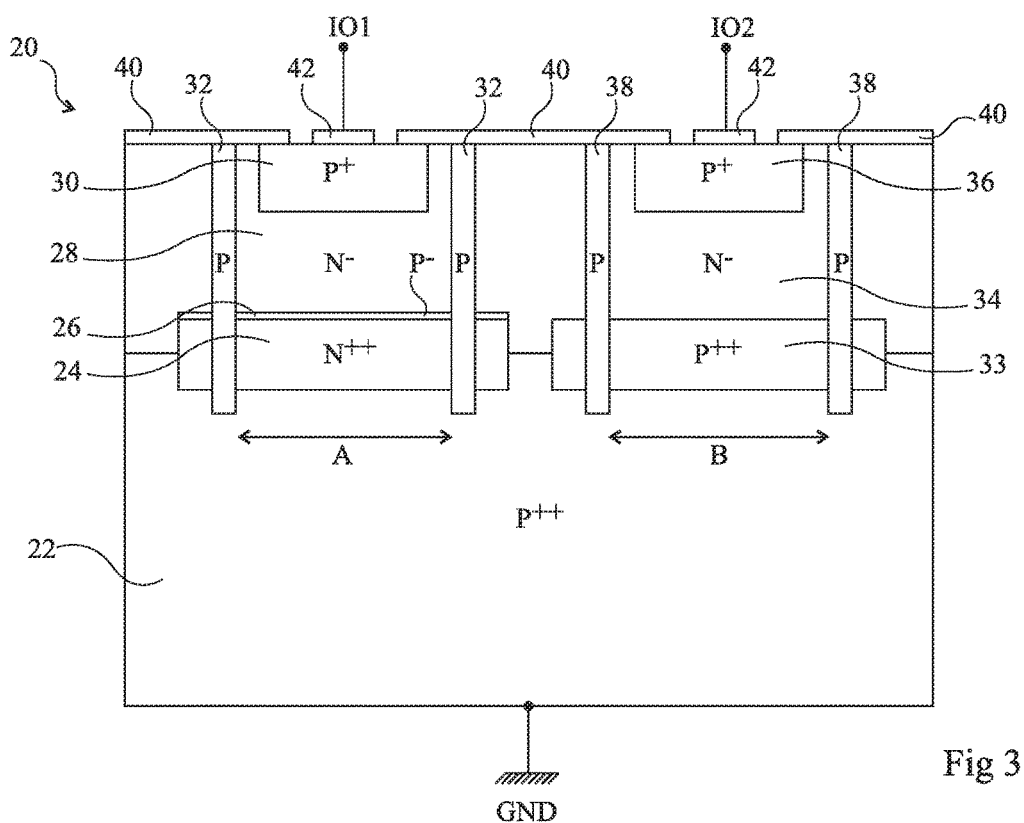
FIG. 3 illustrates an embodiment of a device of protection against electrostatic discharges.

FIG. 3 illustrates an embodiment of a device 20 of protection against electrostatic discharges having an electric diagram corresponding to that shown in FIG. 2. Device 20 comprises a very heavily-doped P-type semiconductor substrate 22 having its rear surface connected to reference node GND. Device 20 further successively comprises, on a portion A of substrate 22, the following structures:
  a heavily-doped N-type semiconductor buried layer 24;
  a thin lightly-doped P-type semiconductor layer 26 having a thickness in the range from 0.3 to 3 µm;
  a lightly-doped N-type semiconductor layer 28, formed by epitaxy and having a thickness which may be greater than 5 µm, for example, in the range from 10 µm to 50 µm; and
  a heavily-doped P-type semiconductor well 30, formed in epitaxial layer 28 and having a thickness in the range from 1 to 5 µm.

Insulation wells 32 extend from the upper surface of epitaxial layer 28 to substrate 22 to laterally delimit portion A of substrate 22. The insulation wells 32 may, for example, be doped with P-type material.

The device further successively comprises, on a portion B of substrate 22, the following structures:
  a heavily-doped P-type semiconductor buried layer 33;
  a lightly-doped N-type semiconductor layer 34 formed by epitaxy at the same time as layer 28; and
  a heavily-doped P-type semiconductor well 36, formed in epitaxial layer 34 and having a thickness in the range from 1 to 5 µm.

Insulation wells 38 extend from the upper surface of layer 34 to substrate 22 to laterally delimit portion B of substrate 22. The insulation wells 38 may, for example, be doped with P-type material.

Insulation wells 32 and 38 are, for example, formed by diffusion, and it should be understood that their contours are not as clear as those shown in FIG. 3. As a variation, insulation wells 32 and 38 may be replaced with insulating trenches.

The upper surface of device 20 supports an insulating layer 40, which does not cover the entire area of the upper surface areas of wells 30 and 36. Each well 30, 36 supports a contact metallization 42 connected to a terminal of the circuit to be protected. Well 30 is thus connected to terminal IO1 and well 36 is thus connected to terminal IO2.

The correspondence between the electric diagram of FIG. 2 and the structural diagram of FIG. 3 is the following. The junction between well 30 and epitaxial layer 28 forms forward diode 3. The junction between epitaxial layer 28 and thin P− layer 26 forms reverse diode 12 having a punch-through operation. The junction between thin P− layer 26 and buried layer 24 forms forward diode 14. The junction between buried layer 24 and substrate 22 forms diode 5. The junction between well 36 and epitaxial layer 34 forms forward diode 7. The junction between epitaxial layer 34 and buried layer 33 forms reverse diode 9.

Figure 4:
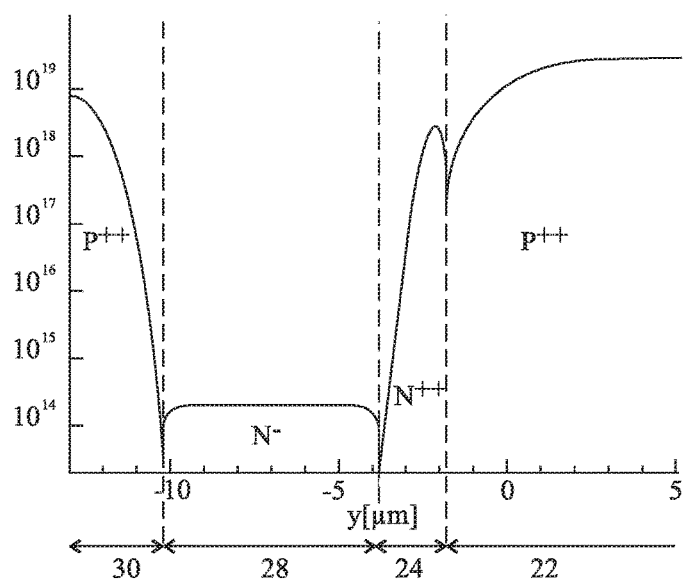
FIGS. 4 and 5 are graphs showing the doping levels of the circuit of protection against electrostatic discharges of FIG. 3.

FIG. 4 is a graph showing an example of the doping levels of successive layers formed on portion A of substrate 22 according to depth. Such doping levels result from steps of implantation and epitaxy possibly after drive-in anneals but before performing all the anneals resulting in a final structure which will be described hereafter in relation with FIG. 5.

In this example, substrate 22 has a doping level in the range from $5 \times 10^{18}$ to $10^{20}$ atoms/cm$^3$, for example, equal to $3 \times 10^{19}$ atoms/cm$^3$. Buried layer 24 has a doping level in the range from $10^{18}$ to $10^{19}$ atoms/cm$^3$, for example, equal to $2 \times 10^{18}$ atoms/cm$^3$. Epitaxial layer 28 has a doping level in the range from $10^{13}$ to $10^{15}$ atoms/cm$^3$, for example, equal to $4 \times 10^{14}$ atoms/cm$^3$. Well 30 has a doping level in the range from $5 \times 10^{18}$ to $5 \times 10^{19}$ atoms/cm3, for example, equal to $9 \times 10^{18}$ atoms/cm$^3$.

The method of manufacturing device 20 comprises the following successive steps, carried out from a P-type substrate 22 very heavily doped with boron atoms:
  forming heavily-doped N-type buried layer 24, by implantation of arsenic atoms;
  forming heavily-doped P-type buried layer 33, preferably by implantation;
  forming lightly-doped P-type layers 28 and 34, by epitaxy; and
  forming, preferably by implantation, heavily-doped P-type wells 30 and 36.

Figure 5:
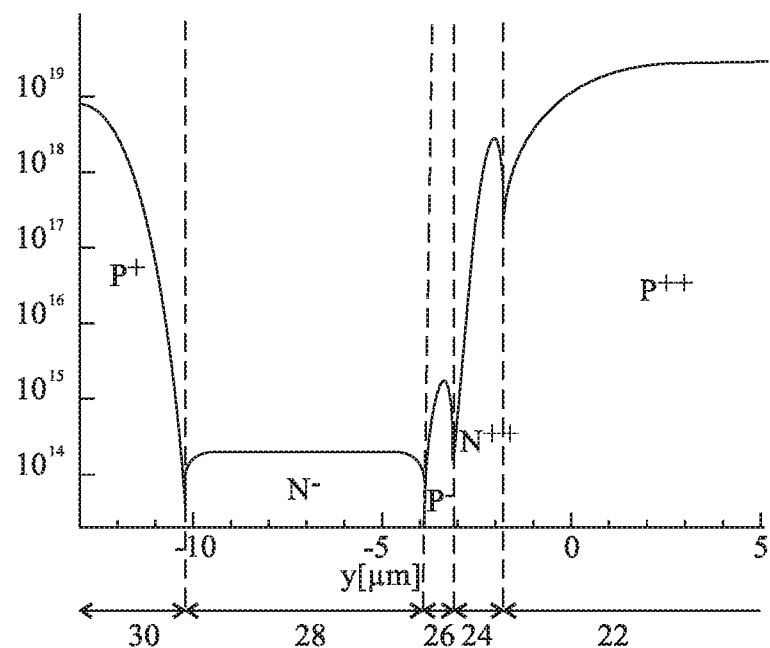

FIG. 5 is a graph showing the doping levels of the semiconductor layers stacked on portion A of substrate 22 according to the depth. These doping levels result from steps of implantation and epitaxy, but also from all the anneals resulting in the structure described in FIG. 3. By comparing FIG. 5 with FIG. 4, the appearing of a thin lightly-doped P-type layer 26 between N-type doped epitaxial layer 28 and N-type doped buried layer 24 can be observed. The doping level of thin P− layer 26 is in the order of $10^{15}$ atoms/cm$^3$ and its thickness is in the order of 1 µm. Thin layer 26 appears due to the diffusion of the boron atoms doping the substrate through buried layer 24. Such a diffusion is possible since buried layer 28 results from the implantation of arsenic atoms rather than of phosphorus atoms. The boron atoms of substrate 22 diffuse much faster than the arsenic atoms of buried layer 24 and can thus diffuse through buried layer 24 to form thin P− layer 26. The characteristics of the different anneals necessary to the method of manufacturing device 20 will be adjusted by those skilled in the art to favor such a diffusion.

Considering a device having a portion A with a surface area in the range from 6,000 to 10,000 µm$^2$, for example, 6,700 µm$^2$, the capacitance of diode 3 in series with diode 5 is in the order of 550 fF in the absence of thin P− layer 26, and 450 fF in the presence of thin P− layer 26, which corresponds to a decrease by 20% of this capacitance.

An advantage of the device described herein, provided with additional thin P− layer 26, is that it can be obtained without adding an additional step to the method of manufacturing a conventional device which is not provided with thin P− layer 26.

As usual, the following terms are used:

lightly-doped semiconductor layer designates a layer having a dopant atom concentration in the range from $10^{14}$ to $5 \times 10^{15}$ atoms/cm$^3$;

heavily-doped semiconductor layer designates a layer having a dopant atom concentration in the range from $10^{17}$ to $10^{18}$ atoms/cm$^3$; and very heavily-doped semiconductor layer designates a layer having a dopant atom concentration in the range from $10^{18}$ to $10^{20}$ atoms/cm$^3$.

Specific embodiments have been described. Various alterations, modifications, and improvements will readily occur to those skilled in the art. In particular:

all conductivity types may be simultaneously inverted;

it can be envisaged to directly implant boron atoms after the forming of buried layer 24 to form thin layer 26; and any type of protection circuit can be envisaged on portion B of the substrate.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing a device of protection against electrostatic discharges, comprising:

implanting, into a very heavily-doped semiconductor substrate of a first conductivity type, a first heavily-doped buried layer of a second conductivity type;

implanting into the very heavily-doped semiconductor substrate a second heavily-doped buried layer of the first conductivity type;

forming by epitaxy a first lightly-doped layer of the second conductivity type over the very heavily-doped semiconductor substrate;

forming a second heavily-doped layer of the first conductivity type in the first lightly-doped layer, and performing a series of anneals causing diffusion of dopant atoms from the very heavily-doped semiconductor substrate through the first heavily-doped buried layer, to form a third layer of the first conductivity type between the first heavily-doped buried layer and the first lightly-doped layer.

2. The method of claim 1, wherein a dopant atom diffusion coefficient of the very heavily-doped semiconductor substrate is larger than a dopant atom diffusion coefficient of the first heavily-doped buried layer.

3. The method of claim 2, wherein the very heavily-doped semiconductor substrate is boron-doped and the first heavily-doped buried layer is arsenic-doped.

4. The method of claim 2, further comprising forming a third heavily-doped layer of the first conductivity type in the first lightly-doped layer.

5. A method of manufacturing a device of protection against electrostatic discharges, comprising:

forming an epitaxial layer doped with a second conductivity type on top of a semiconductor substrate doped with a first conductivity type;

implanting a first buried region doped with the second conductivity type at an interface between the semiconductor substrate and the epitaxial layer;

implanting a second buried region doped with the first conductivity type at the interface between the semiconductor substrate and the epitaxial layer, said second buried doped layer being separated from the first buried doped layer by a portion of the semiconductor substrate;

forming a first well region doped with the first conductivity type in the epitaxial layer over but separated from the first buried region by a portion of the epitaxial layer; and annealing to cause dopant atoms of the first conductivity type from the semiconductor substrate to diffuse through the first buried region and form a layer of the first conductivity type located between the first buried region and the epitaxial layer.

6. The method of claim 5, wherein a dopant atom diffusion coefficient of the semiconductor substrate is larger than a dopant atom diffusion coefficient of the first buried region.

7. The method of claim 5, wherein the semiconductor substrate is boron-doped and the first buried region is arsenic-doped.

8. The method of claim 5, further comprising forming a second well region doped with the first conductivity type in the epitaxial layer over but separated from the second buried region.

9. A method of manufacturing an electrostatic discharge protection circuit including a first diode and a second diode connected in series with each other at their anodes, comprising:

implanting a buried region doped with a second conductivity type at an interface between a semiconductor substrate doped with a first conductivity type and an epitaxial layer doped with the second conductivity type; and annealing to cause dopant atoms of the first conductivity type from the semiconductor substrate to diffuse through the first buried region and form a layer of the first conductivity type located between the buried region and the epitaxial layer;

wherein the epitaxial layer forms a cathode of the first diode, the layer forms the anodes of the first and second diodes, and the buried region forms a cathode of the second diode.

10. The method of claim 9, wherein a dopant atom diffusion coefficient of the semiconductor substrate is larger than a dopant atom diffusion coefficient of the buried region.

11. The method of claim 9, wherein the semiconductor substrate is boron-doped and the buried region is arsenic-doped.

* * * * *